(12) United States Patent
Stoica et al.

(10) Patent No.: US 12,712,567 B2
(45) Date of Patent: Aug. 18, 2026

(54) SENSOR CIRCUIT

(71) Applicant: Infineon Technologies AG, Neubiberg (DE)

(72) Inventors: Dan Ioan Dumitru Stoica, Bucharest (RO); Ioan-Alexandru Nica, Suceava (RO)

(73) Assignee: Infineon Technologies AG, Neubiberg (DE)

( * ) Notice: Subject to any disclaimer, the term of this patent is extended or adjusted under 35 U.S.C. 154(b) by 141 days.

(21) Appl. No.: 18/793,102

(22) Filed: Aug. 2, 2024

(65) Prior Publication Data

US 2025/0062774 A1 Feb. 20, 2025

(30) Foreign Application Priority Data

Aug. 17, 2023 (DE) ......................... 102023122077.2

(51) Int. Cl.
*H03M 3/00* (2006.01)

(52) U.S. Cl.
CPC ........... *H03M 3/494* (2013.01); *H03M 3/464* (2013.01)

(58) Field of Classification Search
CPC ....... H03M 3/354; H03G 3/002; H03G 3/008; H03G 2201/103; H03G 2201/502
See application file for complete search history.

(56) References Cited

U.S. PATENT DOCUMENTS 4,939,516 A * 7/1990 Early ...................... H03M 3/34 375/247
5,039,989 A * 8/1991 Welland ................. H03M 3/34 341/118
6,411,242 B1 * 6/2002 Oprescu ................. H03M 3/34 341/143
6,927,717 B1 * 8/2005 Oprescu ................. H03M 3/34 341/143
7,362,255 B1 * 4/2008 Tsyrganovich ......... H03M 3/34 341/172
7,486,214 B1 * 2/2009 Di Giandomenico ....................... H03M 3/386 327/552
7,545,302 B1 * 6/2009 Silva ..................... H03M 3/476 341/143
7,545,303 B1 * 6/2009 Silva ..................... H03M 3/476 341/143
7,724,170 B2 * 5/2010 Pun ......................... H03M 3/34 330/9

(Continued)

FOREIGN PATENT DOCUMENTS

CN 104639170 A 5/2015
DE 102021128262 A1 6/2022
EP 3402077 A1 11/2018

*Primary Examiner* — Lam T Mai
(74) *Attorney, Agent, or Firm* — Harrity & Harrity, LLP

(57) ABSTRACT

The present disclosure relates to a sensor circuit including an analog chopper circuit configured to shift an analog input signal from an original frequency to a chopping frequency to generate a chopped analog signal, a ΣΔ-modulator coupled to an output of the analog chopper circuit and configured to digitize the chopped analog signal at a sampling frequency to generate a chopped digital signal, and a digital chopper circuit coupled to an output of the ΣΔ-modulator and configured to demodulate the chopped digital signal to generate a demodulated chopped digital signal having a signal component at the original frequency.

18 Claims, 4 Drawing Sheets

(56) References Cited

U.S. PATENT DOCUMENTS

| | | | | |
|---|---|---|---|---|
| 8,829,988 | B2 * | 9/2014 | Motz | H03F 3/38 330/9 |
| 9,413,383 | B1 * | 8/2016 | Sharma | H03M 3/384 |
| 9,685,967 | B1 * | 6/2017 | Motz | H03M 3/34 |
| 9,800,262 | B1 * | 10/2017 | Maurino | H03M 1/08 |
| 9,859,907 | B1 * | 1/2018 | Li | H03M 1/0678 |
| 11,245,410 | B1 * | 2/2022 | Dalla Longa | H03M 1/66 |
| 11,522,553 | B2 * | 12/2022 | Bal | H03M 1/1014 |
| 11,848,682 | B2 * | 12/2023 | Rubinsztain | H03M 1/1245 |
| 2005/0068221 | A1 | 3/2005 | Freeman et al. | |
| 2009/0140900 | A1 * | 6/2009 | Pun | H03M 3/34 330/7 |
| 2011/0025402 | A1 * | 2/2011 | Balachandran | H03M 3/34 327/427 |
| 2011/0215955 | A1 * | 9/2011 | Motz | H03M 1/02 341/110 |
| 2013/0335247 | A1 * | 12/2013 | Ceballos | H03M 3/344 341/143 |
| 2014/0077873 | A1 * | 3/2014 | Motz | H03F 3/45977 330/9 |
| 2016/0252599 | A1 * | 9/2016 | Motz | G01R 33/075 324/251 |
| 2016/0373125 | A1 | 12/2016 | Pagnanelli | |
| 2017/0207761 | A1 * | 7/2017 | Raman | H03F 3/005 |
| 2019/0149164 | A1 * | 5/2019 | Lien | H03M 3/494 341/118 |
| 2019/0199367 | A1 * | 6/2019 | Na | H03M 1/145 |
| 2019/0341926 | A1 * | 11/2019 | Mathur | H03M 1/361 |
| 2021/0126648 | A1 * | 4/2021 | Zhang | H03M 1/1061 |
| 2021/0351780 | A1 * | 11/2021 | Bal | H03M 1/1014 |
| 2022/0263519 | A1 * | 8/2022 | Melanson | H03M 3/414 |
| 2023/0102232 | A1 * | 3/2023 | Breems | H03M 3/34 341/143 |
| 2023/0179224 | A1 * | 6/2023 | Bandyopadhyay | H03M 3/452 341/143 |
| 2023/0223949 | A1 | 7/2023 | Rubinsztain et al. | |
| 2023/0361784 | A1 * | 11/2023 | Maurino | H03M 3/356 |
| 2024/0250693 | A1 * | 7/2024 | Gheorghe | H03M 3/464 |

* cited by examiner

SENSOR CIRCUIT

CROSS-REFERENCE TO RELATED APPLICATION

This application claims priority to Germany Patent Application No. 102023122077.2 filed on Aug. 17, 2023, the content of which is incorporated by reference herein in its entirety.

TECHNICAL FIELD

The present disclosure generally relates to analog-to-digital converters (ADCs) and, more particularly, to sigma-delta analog-to-digital converters (ΣΔ-ADCs) for chopped sensors.

BACKGROUND

Many modern devices, such as vehicles, for example, include a plurality of sensors. Such sensors may be "fast switching" to provide information about an operation of a device to a digital control unit, which can take an action based upon the information. For example, the control unit of a vehicle may be configured to control fuel injection components based on a position of a camshaft. To this end, a toothed wheel may be affixed to the camshaft and a magnetic sensor, e.g., Hall sensor, may be arranged to detect teeth on the wheel. The sensor may output an analog signal that indicates the presence (or absence) of a tooth. The sensor's analog signal may be converted to a digital signal by an ADC to enable digital processing components in the control unit to determine the position of the camshaft. Both ADCs and digital-to-analog converters (DACs) can employ sigma-delta (ΣΔ or SD) modulation. A ΣΔ ADC may first encode an analog signal using high-frequency ΣΔ modulation, and then apply a digital filter to form a higher-resolution but lower sample-frequency digital output. A ΣΔ DAC may encode a high-resolution digital input signal into a lower-resolution but higher sample-frequency signal that may be mapped to voltages, and then may be smoothed with an analog filter. In both cases, the temporary use of a lower-resolution signal may simplify circuit design and improve efficiency.

ΣΔ ADCs and ΣΔ DACs may be combined with chopping. Chopping refers to a technique that can be used to cancel offset voltages and other low frequency errors. Chopping circuits are a type of electrical circuit in which a signal to be amplified is modulated (chopped), amplified and demodulated again. By using such a technique, a zero-point error (or offset error) and a so-called 1/f noise of an amplifier can be shifted to a frequency band which is not of interest. Chopping circuits can be used, for example, in bandgap circuits that provide a defined reference voltage, but can also be used in other applications where a signal needs to be processed, such as in ΣΔ-ADCs. An offset that arises within various amplifiers of a ΣΔ modulator can generally be nulled out, either by local chopping followed by filtering or auto-zeroing an amplifier. However, other offset errors cannot be removed by these means. A solution implemented on these ADCs may be to chop an entire analog signal chain within the ADC. This may remove any offset and low frequency errors, giving extremely low offset errors and drift.

It may be desirable to decrease offsets, noise, and loop complexity for ΣΔ-ADCs for chopped sensors.

SUMMARY

This need is addressed by apparatuses and methods in accordance with the appended claims.

According to a first aspect, it is proposed a sensor circuit. The sensor circuit includes an analog chopper circuit configured to shift an analog input (sensor) signal from an original frequency to a chopping frequency to generate a chopped analog signal. The sensor circuit also includes a ΣΔ-modulator coupled to an output of the analog chopper circuit. Thus, the analog chopper circuit may be regarded as external to the ΣΔ-modulator. The ΣΔ-modulator is configured to sample the chopped analog signal at a sampling frequency to generate a chopped digital signal. The sensor circuit further includes a digital chopper circuit coupled to an output of the ΣΔ-modulator and configured to demodulate the chopped digital signal to generate a demodulated chopped digital signal having a signal component at the original frequency. Thus, the digital chopper circuit may also be regarded as external to the ΣΔ-modulator. demodulation (de-chopping) is done in the digital domain.

The present disclosure proposes a sensor circuit having the analog chopper circuit (for modulation) upstream to the ΣΔ-modulator and the digital chopper circuit (for demodulation) downstream to the ΣΔ-modulator. The ΣΔ-modulator itself is configured without a chopper circuit, e.g., no chopper circuit in the feedforward path of the ΣΔ-modulator and no chopper circuit in the feedback path of the ΣΔ-modulator. Therefore, the present disclosure proposes a non-chopped EA ADC for chopped sensors.

In some implementations, a ratio between the sampling frequency of the ΣΔ-modulator and the chopping frequency is larger than 50 or even larger than 100. In this way, the proposed sensor circuit may get a wideband character and signal components at the chopping frequency and one or more harmonics thereof may pass the ΣΔ-modulator.

In some implementations, the ΣΔ-modulator includes an ADC and an analog loop filter coupled between the output of the analog chopper circuit and the ADC. That is, the analog loop filter (integrator) is upstream to the ADC.

In some implementations, the analog loop filter may be implemented as continuous time (CT) loop filter. In an analog CT loop filter, both the input and output signals of the analog loop filter are continuous-time signals. The analog loop filter processes the input signal in its continuous-time form and produces a continuous-time output signal, which can be converted to a digital signal using the ADC. In a discrete-time (DT) analog loop filter, on the other hand, the input signal (chopped analog signal) would be sampled and processed in discrete time using a clock signal, and the output signal would be a sequence of discrete-time samples. A DT analog loop filter typically includes a sample-and-hold circuit (e.g., a switched-capacitor (SC) circuit) to capture the input signal at the clock rate.

In some implementations, the ΣΔ-modulator includes a multi-bit ADC coupled to an output of the analog loop filter (integrator). The multi-bit ADC is configured to convert the chopped analog signal from analog to digital to generate the chopped digital signal. The multi-bit ADC may have a bit width larger than two bits, e.g., a bit width of four or six bits.

In some implementations, the ΣΔ-modulator includes a feedback path from an output of the ΣΔ-modulator (the output of the ADC) to the input of the ΣΔ-modulator (the input of the analog loop filter). The feedback path includes a multi-bit DAC configured to convert the chopped digital signal back to analog. The multi-bit DAC may have a bit width corresponding to the bit width of the multi-bit ADC in the feedforward path. Thus, the multi-bit DAC may have a bit width larger than two bits, e.g., a bit width of four or six bits.

In some implementations, the ΣΔ-modulator includes a single-bit ADC configured to convert the chopped analog signal from analog to digital to generate the chopped digital signal. The ΣΔ-modulator may also include a feedback path from an output of the ΣΔ-modulator to the input of the ΣΔ-modulator, wherein the feedback path includes a single-bit DAC configured to convert the chopped digital signal back to analog.

In some implementations, the sensor circuit may further include a digital filter coupled to an output of the digital chopper circuit. The digital filter is configured to reject at least signal components at the chopping frequency. The digital filter may also be configured to reject signal components at one or more harmonics of the chopping frequency.

In some implementations, the digital filter includes a notch filter having a notch at least at the chopping frequency. The notch filter may also have notches at one or more harmonics of the chopping frequency.

In some implementations, the digital filter additionally or alternatively includes a lowpass filter configured to allow signal components at the original frequency pass through while attenuating signal components at the chopping frequency or higher.

In some implementations, the digital filter includes a combination of a lowpass filter and a notch filter. This may be useful when the energy of signal components at the chopping frequency is large.

In some implementations, the sensor circuit may further include a digital filter coupled between an output of the ΣΔ-modulator (the output of the ADC) and the input of the digital chopper circuit. The digital filter may be configured to reject one or more harmonics of the chopping frequency. This digital filter may cause a filter delay. Thus, the sensor circuit further may include a delay element coupled between a chopping clock signal and the digital chopper circuit using the chopping clock signal for demodulation. The delay element may be configured to cause a delay of the chopping clock signal corresponding to the filter delay.

In some implementations, the sensor circuit may further include an amplifier coupled between the analog chopper circuit and the ΣΔ-modulator and configured to amplify the chopped analog signal. The amplifier may be useful in case of weak sensor signals. The amplifier may include an Operational Transconductance Amplifier (OTA), for example.

In some implementations, the digital chopper circuit is configured to multiply the chopped digital signal with a digital sinusoidal signal having the chopping frequency. A sinusoidal signal only has one frequency component and may thus be beneficial with regards to a generation of further harmonics and may thus simplify filter design.

BRIEF DESCRIPTION OF THE DRAWINGS

Some examples of apparatuses and/or methods will be described in the following by way of example only, and with reference to the accompanying figures, in which.

DETAILED DESCRIPTION

Figures 1, 2:
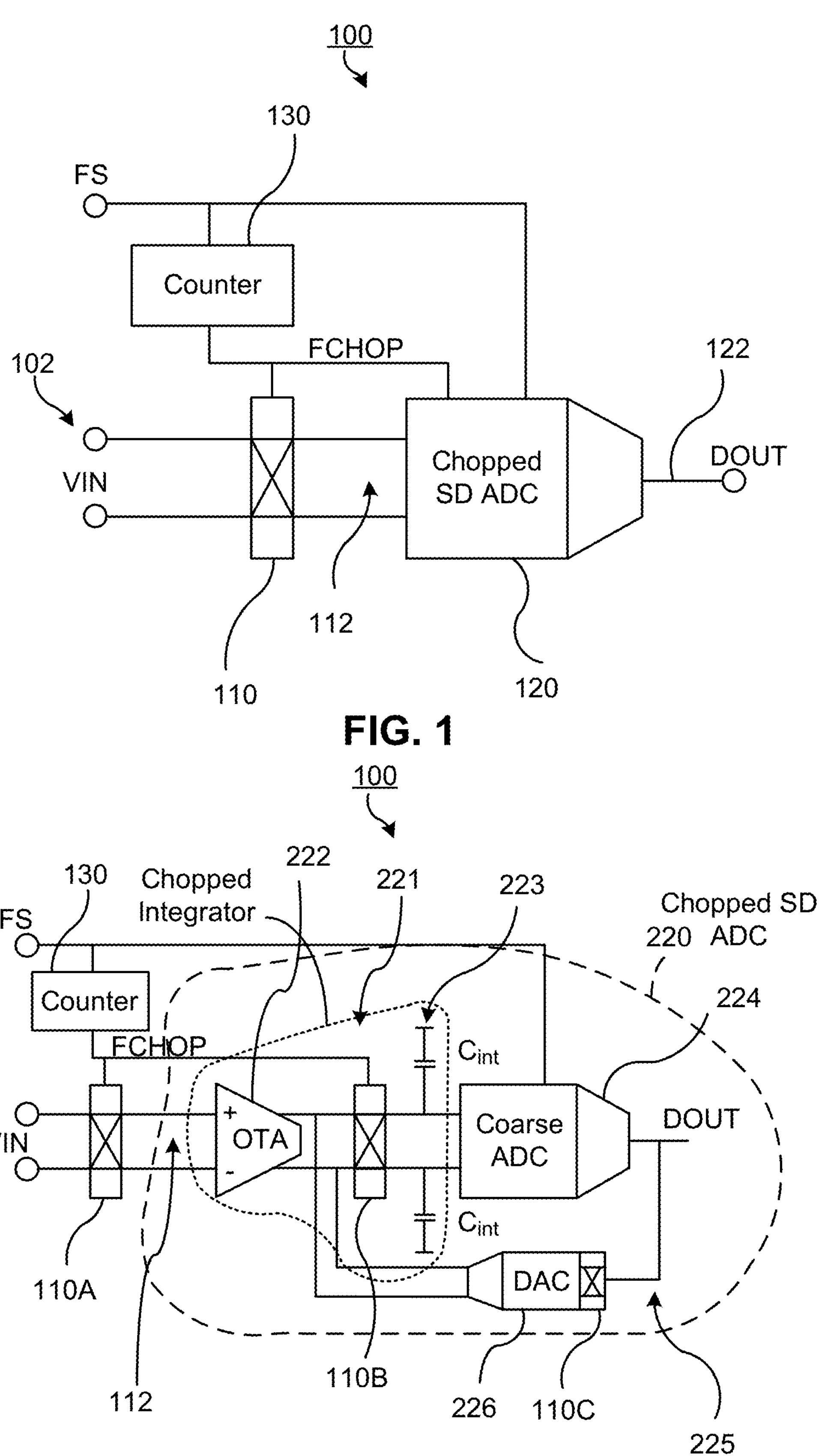
FIG. 1 illustrates a schematic block diagram of a sensor system that comprises a chopped ΣΔ-ADC for converting an analog input signal at an original frequency to a digital output signal.
FIG. 2 shows a block diagram of an example implementation of a chopped ΣΔ-ADC circuit.

Some examples are now described in more detail with reference to the enclosed figures. However, other possible examples are not limited to the features of these implementations described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, e.g., only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

Sensors often introduce errors into an analog signal they output due to intrinsic characteristics of the sensors themselves. For example, an offset error may be included in an analog signal output by a Hall sensor. However, spinning current techniques may help to distinguish between the error and the sensor signal. The spinning technique may transform the offset error component in the Hall sensor signal into a high frequency error (called offset ripple) while the sensor signal remains low frequency or DC.

ADCs may include amplifiers and/or integrators that may also introduce an offset error into the signals they process. The amplifier or integrator offset error may add to the offset error introduced by the Hall sensor. To compensate for the sensor's offset error and/or amplifier offset error, some ADCs include choppers. Choppers are circuits that modulate the sensor signal to a higher frequency, which shifts the sensor output signal to a higher frequency range (e.g., the chopping frequency $f_{chop}$) while the offset error component remains in a lower frequency range, making the offset error component easier to distinguish from the signal component. For the purposes of this description, the modulated sensor signal at the chopping frequency output by chopper circuit will be referred to as being "chopped" or "at the chopping frequency" to be contrasted with sensor signals that have not been modulated or have been re-modulated to the original frequency of the sensor signal, which will be referred to as having "the original frequency."

FIG. 1 illustrates a schematic block diagram of a sensor system that comprises an ADC circuit 100 for converting an analog input signal VIN (e.g., a sensor signal) at an original frequency to a digital output signal DOUT.

The analog input signal VIN may be assumed to be band-limited, and the signal bandwidth may be assumed to be much lower than a sampling frequency $f_s$ of the ADC circuit 100. The analog input signal VIN may include a signal component and an offset error component that may be introduced by a sensor (not shown) measuring a physical quantity (e.g., a Hall sensor to measure a magnetic field). To account for the offset error component in the analog input signal VIN, the ADC circuit 100 comprises an analog chopper circuit 110 coupled between an input terminal 102 for the analog input signal VIN and an input terminal of a chopped ΣΔ-ADC circuit 120. The analog chopper circuit (modulator) 110 may be considered external to the chopped ΣΔ-ADC circuit 120 and comprises a modulator circuit which is clocked (switched) at a chopping frequency $f_{chop}$. The chopping frequency $f_{chop}$ may be lower than the sampling frequency $f_s$ of the ADC circuit 100. A chopping clock signal at chopping frequency $f_{chop}$ may be derived from a sampling clock signal at sampling frequency $f_s$ using a timing circuit 130. Timing circuit 130 may be configured to perform a frequency division of the sampling frequency $f_s$ to obtain the chopping clock signal at chopping frequency $f_{chop}$. For example, this may be done via a counter which triggers a state transition (from low to high, or from high to low) of the chopping clock signal after j sampling clock pulses. The chopper or modulator circuit 110 is configured to shift the analog input signal VIN from its original frequency (which may be DC) at or around the chopping frequency $f_{chop}$ to generate a chopped analog signal 112 at the input of chopped ΣΔ-ADC circuit 120.

In accordance with various example implementations, the chopped ΣΔ-ADC circuit 120 may include an amplifier circuit for the chopped analog signal 112 to generate an amplified chopped analog signal, a demodulator circuit clocked at the chopping frequency $f_{chop}$ and configured to demodulate the amplified chopped analog signal to generate a demodulated analog signal having a signal component at the original frequency. The analog demodulator circuit, which may also be referred to as analog chopper circuit, is internal to the chopped ΣΔ-ADC circuit 120 and is the reason why one speaks of a chopped ΣΔ-ADC circuit 120. The ΣΔ-ADC circuit 120 may further include a ΣΔ modulator and a digital/decimation filter to convert the analog input signal VIN to a digital output signal 122 (DOUT). The ΣΔ modulator may coarsely sample the analog input signal VIN at a very high rate into a 1-bit stream. The digital decimation filter may then take this sampled data and convert it into a high-resolution, slower digital code.

A block diagram of an example implementation of ADC circuit 100 for converting an analog input signal VIN at an original frequency to a digital output signal DOUT is shown in FIG. 2.

The chopped ΣΔ-ADC circuit of FIG. 2 comprises a (oversampling) ΣΔ-modulator 220. The ΣΔ-modulator 220 includes a forward path 221 and a feedback path 225. The forward path 221 may include a pair of analog chopper circuits 110A/110B (external chopper circuit 110A and internal chopper circuit 110B), a voltage to current converter (OTA) 222 which contains an offset of its own, a loop filter (integrator) 223, and a coarse ADC (e.g., 1-bit comparator) 224 clocked at the sampling frequency/rate $f_s$. The integrator 223 has the effect of shaping quantization noise to higher frequencies. OTA 222 may convert the differential voltage VIN between its non-inverting and inverting input to currents at its outputs. OTA 222 may also be referred to as difference (or differential) amplifier. Recall that the sensor signal VIN from the Hall sensor (or another sensor type) may be a very small nearly DC signal with an offset error that is caused by intrinsic characteristics of the Hall sensor. The external analog chopper 110A multiplies the analog sensor signal VIN by a square wave having the chopping frequency $f_{chop}$ and amplitudes of +1 and −1. The resulting chopped analog input signal 112 has a signal component corresponding to a square wave having period $T_{chop}=1/f_{chop}$ and an offset error component that is DC.

The OTA 222 may then be used to amplify the chopped analog input signal 112. The OTA 222 may also introduce a DC amplifier offset error that adds to the DC offset error of the Hall sensor. After the chopped analog input signal 112 is amplified, the amplified signal at the output of OTA 222 may be demodulated by the second internal analog chopper circuit 110B to generate a signal in which the sensor component of the signal component has its original low frequency while the offset component (including both the Hall and amplifier offset) is an AC signal at the chopping frequency $f_{chop}$. The coarse ADC 224 converts the output of the integrator 223 to a digital value, which is the digital output signal DOUT of the ΣΔ-modulator 220. The coarse ADC 224 may include a digital decimation filter.

The feedback path 225 of the ΣΔ-modulator 220 may include a chopped DAC 226 to convert the digital output signal DOUT to analog for combination with the output signal of OTA 222. The combination is a difference between the amplified signal at the output of OTA 222 and the output signal of chopped DAC 226. Thus, a difference is obtained in current domain at the output of OTA 222. The chopped analog input signal 112 may thus be differentiated in current domain at the output of OTA 222. This differentiated signal (difference between the amplified signal at the output of OTA 222 and the output signal of chopped DAC 226) may essentially correspond to a quantization error and is presented to the second analog chopper circuit 110B and to integrator 223, whose output progresses in a negative or positive direction. The slope and direction of the output of the integrator 223 is dependent on the sign and magnitude of the differentiated signal. At the time the differentiated signal equals the coarse ADC's (comparator's) 224 reference voltage, the output of the coarse ADC 224 switches from negative to positive, or positive to negative, depending on its original state. The output value DOUT of the coarse ADC 224 is clocked back into the 1-bit DAC 226, as well as clocked out to a digital filter stage (not shown).

When the analog choppers 110A, 110B change state at their half periods (chopping phases) (changing amplitudes from 1→−1, or from −1→1), the chopped analog input signal 112 changes its polarity, causing a current spike due to the charging of parasitic capacitors (not shown) at the input of the OTA 222. The differential chopped analog input signal is mostly provided by the OTA 222 via integration capacitors. However, the feedback signal is chopped again, making it independent of chopping edge direction. The feedback signal is then integrated on the integration capacitors ($C_{int}$), resulting in an accumulated error signal. Any parasitic capacitors will result in sampling of quantization noise also at $f_{chop}$.

The skilled person having benefit from the present disclosure will appreciate that chopped ΣΔ-ADC circuit designs are not limited to the example of FIG. 2.

Compared to chopped ΣΔ-ADC circuits illustrated in FIGS. 1 and 2, the present disclosure proposes circuits employing non-chopped ΣΔ-ADC circuits. Here, a non-chopped ΣΔ-ADC circuit shall be understood as a ΣΔ-ADC configured without any chopper circuit, e.g., no chopper circuit in the feedforward path and no chopper circuit in the feedback path. Non-chopped ΣΔ-ADC circuits may provide for low offset, low/moderate noise, and/or low ripple loop complexity.

Figure 3:
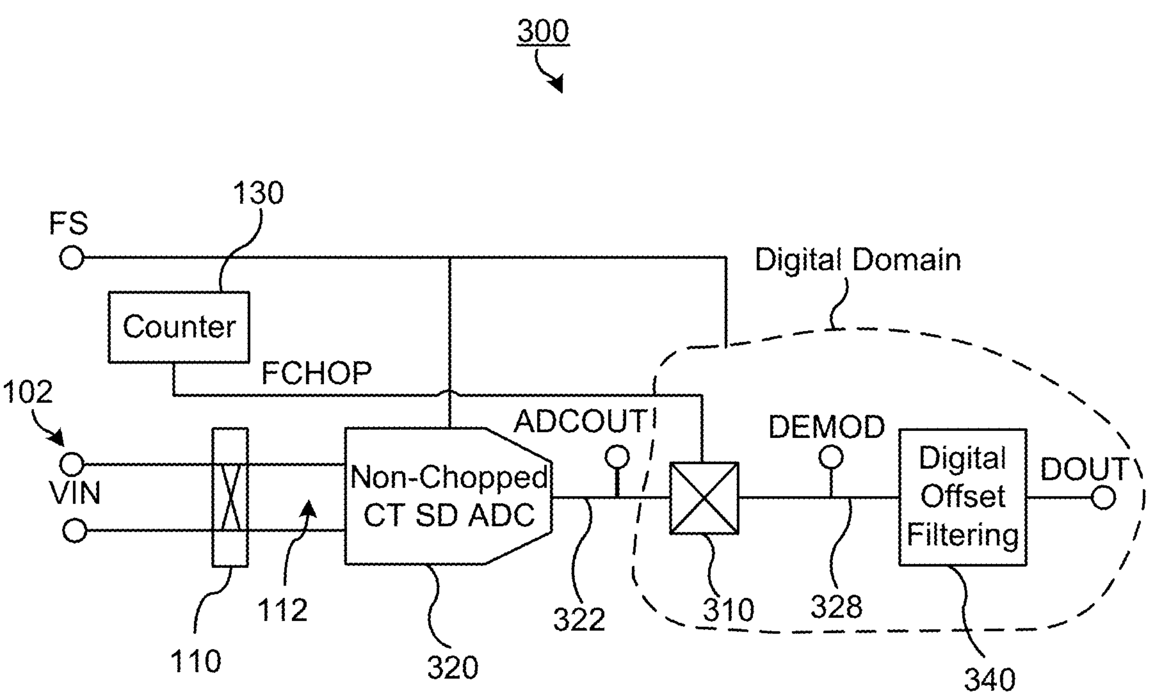
FIG. 3 illustrates a schematic block diagram of a sensor circuit that comprises a non-chopped ΣΔ-ADC for converting an analog input signal at an original frequency to a digital output signal.

FIG. 3 illustrates a schematic block diagram of a circuit 300 implementing a non-chopped ΣΔ-ADC circuit for converting the analog input signal VIN (e.g., a sensor signal) at the original frequency to the digital output signal DOUT.

Like ADC circuit 100, circuit 300 comprises the analog chopper circuit 110 which is configured to shift the analog input signal VIN 102 from its original frequency to the chopping frequency $f_{chop}$ to generate the chopped analog signal 112 at the input of non-chopped ΣΔ-ADC circuit 320. Again, the analog input signal VIN may be assumed to be band-limited, and the signal bandwidth may be assumed to be much lower than the sampling frequency $f_s$ of the non-chopped ΣΔ-ADC circuit 320. The analog input signal VIN may include a signal component and an offset error component that may be introduced by a sensor (not shown) measuring a physical quantity (e.g., a Hall sensor to measure a magnetic field). The analog chopper circuit (modulator) 110 may be considered external to the non-chopped ΣΔ-ADC circuit 320 and comprises a modulator circuit which is clocked or switched at chopping frequency $f_{chop}$. The chopping frequency $f_{chop}$ may be much lower than the sampling frequency $f_s$ of the non-chopped ΣΔ-ADC circuit 320. For example, a ratio between the sampling frequency $f_s$ and the chopping frequency $f_{chop}$ may be larger than 100. The chopping clock signal at chopping frequency $f_{chop}$ may be derived from the sampling clock signal at sampling frequency $f_s$ using the timing circuit 130, which has been explained earlier.

In accordance with various example implementations, the non-chopped ΣΔ-ADC circuit 320 may include—like the chopped ΣΔ-ADC circuit 120—an amplifier circuit (not shown) for the chopped analog signal 112 to generate an amplified chopped analog signal. The non-chopped ΣΔ-ADC circuit 320 may further include a 24 modulator to convert the chopped analog signal 112 to a chopped digital signal 322 (ADCOUT). The ΣΔ modulator may convert the (amplified) chopped analog signal 112 into a digital signal 322 having sampling frequency $f_s$. Compared to the 1-bit ADC of chopped ΣΔ-ADC circuit 120, the proposed non-chopped ΣΔ-ADC circuit 320 may include a single-bit ADC or a multi-bit ADC having a bit-width larger than two bits.

The circuit 300 of FIG. 3 also comprises a digital chopper circuit 310 (digital demodulator) coupled to an output of non-chopped ΣΔ-ADC circuit 320 and configured to demodulate the chopped digital signal 322 to generate a demodulated digital signal 328 having a signal component at the original frequency. Like the analog chopper circuit 110, the digital chopper circuit (demodulator) 310 may be considered external to the non-chopped ΣΔ-ADC circuit 320 and comprises a digital demodulator circuit using the chopping clock signal at chopping frequency $f_{chop}$. Thus, analog chopper circuit (modulator) 110 and digital chopper circuit (demodulator) 310 are both external to (outside) the non-chopped ΣΔ-ADC circuit 320. Non-chopped ΣΔ-ADC circuit 320 itself does not contain any chopper circuits.

Figure 4A:
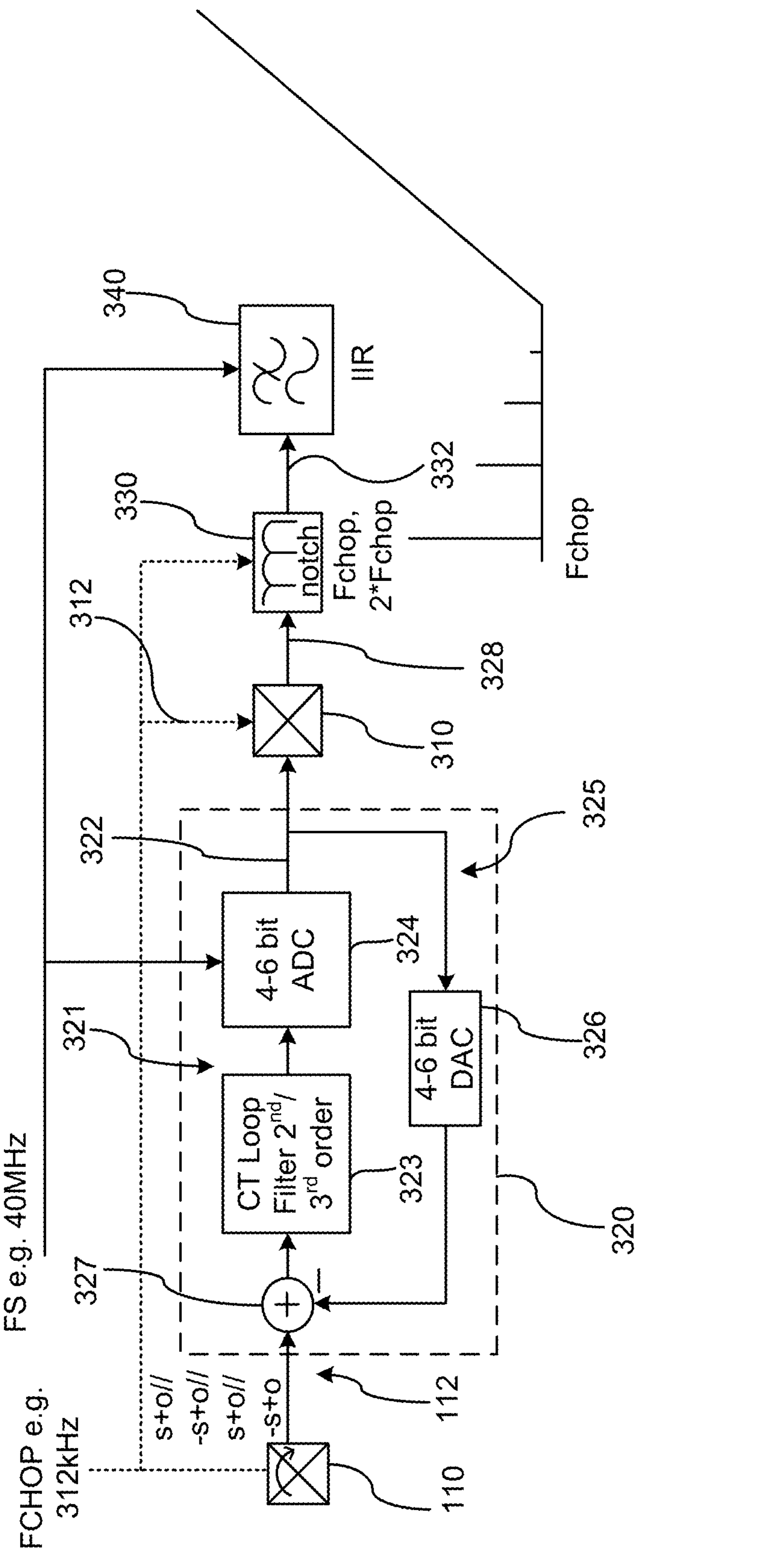
FIG. 4A shows a first implementation of the sensor circuit of FIG. 3.

FIG. 4A shows an implementation of the sensor circuit 300 including the non-chopped ΣΔ-ADC circuit 320.

The analog chopper circuit 110 multiplies the analog sensor signal VIN by a square wave having the chopping frequency $f_{chop}$ and amplitudes of +1 and −1, for example. In the illustrated example, the chopping frequency $f_{chop}$ is 312 kHz. The resulting chopped analog input signal 112 has a signal component corresponding to a square wave having period $T_{chop}=1/f_{chop}$ and an offset error component that is DC. An amplifier (not shown) coupled to the output of analog chopper 110 may then be used to amplify the chopped analog input signal 112. The amplifier (e.g., an OTA) may also introduce a DC amplifier offset error that adds to the DC offset error of the Hall sensor. The (amplified) chopped analog input signal 112 may then be fed into the non-chopped ΣΔ-ADC circuit 320 which may also be referred to as non-chopped ΣΔ-modulator circuit. The non-chopped ΣΔ-modulator circuit 320 comprises a forward path 321 and a feedback path 325.

At its input, the non-chopped ΣΔ-modulator circuit 320 comprises a differentiator 327 for determining a difference between the chopped analog input signal 112 and the chopped digital signal 322 which is fed back from the output of non-chopped ΣΔ-modulator circuit 320. This difference may be regarded as a quantization error. The quantization error is then further passed from differentiator 327 to an analog loop filter (integrator) 323 in the feedforward path 321 of non-chopped ΣΔ-modulator circuit 320. Feedforward path 321 also comprises a multi-bit ADC 324 coupled to the output of analog loop filter 323. The multi-bit ADC 324 may have a bit-width of two to six bits, for example, and may be clocked with the sampling frequency $f_s$. In the illustrated example, the sampling frequency $f_s$ is 40 MHZ, e.g., $f_s/f_{chop}>100$.

A function of the analog loop filter 323 is to shape noise and attenuate out-of-band signals before feeding them to the multi-bit ADC 324. It may also help in achieving high-order noise shaping. The analog loop filter 323 in the forward path 321 may be implemented in continuous time (CT) using a combination of analog components such as operational amplifiers and passive elements. This means that the CT analog loop filter 323 operates on a continuous-time signal without any discrete sampling or quantization. CT analog loop filter 323 can provide high precision and is well-suited for high-frequency applications. The latter may be the case as the ratio between the sampling frequency $f_s$ and the chopping frequency $f_{chop}$ may be larger than 100. This large ratio provides wideband characteristic to the non-chopped ΣΔ-modulator circuit 320.

As shown in the example of FIG. 4A, an order of the analog loop filter 323 may be two or three, for example. The order refers to the number of integrators cascaded in the analog loop filter 323. It indicates the complexity and the degree of filtering achieved by the analog loop filter 323. The order of the analog loop filter 323 is determined by the desired noise shaping characteristics and the specific requirements of the application. In general, higher-order loop filters provide better noise shaping performance but may require more complex circuitry and introduce additional challenges in terms of stability and implementation. The order of the loop filter is typically denoted as an integer value. For example, a first-order loop filter contains one integrator or energy-storage element, while a second-order loop filter contains two integrators, and so on. The choice of the order of the loop filter depends on various factors such as the desired noise shaping performance, the signal bandwidth of interest, the available resources, and the trade-offs between complexity, stability, and power consumption.

The analog loop filter 323 and the ratio between the sampling frequency $f_s$ and the chopping frequency $f_{chop}$ may be configured in such a way that the non-chopped ΣΔ-modulator circuit 320 allows frequency components at the chopping frequency $f_{chop}$ and integer multiples thereof (harmonics) to pass. For example, the analog loop filter 323 and the ratio between the sampling frequency $f_s$ and the chopping frequency $f_{chop}$ may be configured such that the chopping frequency $f_{chop}$ up to at least the third harmonic may pass through the non-chopped ΣΔ-modulator circuit 320. For another example, the analog loop filter 323 and the ratio between the sampling frequency $f_s$ and the chopping frequency $f_{chop}$ may be configured such that the chopping frequency $f_{chop}$ up to at least the fifth harmonic may pass through the non-chopped ΣΔ-modulator circuit 320 without attenuation.

The feedback path 325 of the non-chopped ΣΔ-modulator circuit 320 may include a non-chopped multi-bit DAC (also called ΣΔ-DAC) 326 to convert the chopped digital signal 322 (ADCOUT) to analog for combination with the chopped analog input signal 112. The multi-bit DAC 326 may have a bit-width of four to six bits, for example, and may be clocked with the sampling frequency $f_s$. As mentioned before, the combination at differentiator 327 may be a difference between the (amplified) chopped analog input signal 112 and the output signal of non-chopped multi-bit DAC 326. This difference may be obtained in current domain at the output of optional amplifier, for example. The chopped analog input signal 112 may thus be differentiated in current domain. This differentiated signal (difference between the chopped analog input signal 112 and the output signal of non-chopped DAC 326) is presented to the analog loop filter (integrator) 323, whose output progresses in a negative or positive direction. The slope and direction of the output of the integrator 323 is dependent on the sign and magnitude of the differentiated signal. The skilled person having benefit from the present disclosure will appreciate that DAC 326 may also be implemented as a single-bit DAC in case ADC 324 is implemented as a single-bit ADC.

In the sensor circuit 300 of FIG. 4A, the chopped digital signal 322 at the output of multi-bit ADC 324 is then fed to the digital chopper circuit (demodulator) 310 which is configured to multiply the chopped digital signal 322 with a digital demodulation signal 312 having the chopping frequency $f_{chop}$ to obtain a digital demodulated signal 328. While the digital demodulation signal 312 may be a binary signal (e.g., ±1), it may be preferred to use a sinusoidal digital demodulation signal 312 (e.g., sin $(2\pi f_{chop}t)$. In this way, the generation of harmonics may be reduced. Thus, the counterpart to the modulation performed by analog chopper circuit 110 at the input of non-chopped ΣΔ-modulator circuit 320 is the digital chopper circuit 310 at the output of non-chopped ΣΔ-modulator circuit 320. In the example of FIG. 4A, reference numeral 312 also denotes the modulation signal for analog chopper circuit 110. The skilled person having benefit from the present disclosure will appreciate that modulation and demodulation signals may be different signals and only the (digital) demodulation signal 312 may be sinusoidal.

The digital demodulated signal 328 may be fed to a digital filter 330 which is coupled to the output of the digital chopper circuit 310 and which is configured to reject signal components having at least the chopping frequency $f_{chop}$. The digital filter 330 may be clocked with a clock signal having the chopping frequency $f_{chop}$. The digital filter 330 may comprise a digital notch filter having a notch at least at the chopping frequency $f_{chop}$. Further notches at one or more harmonics of the chopping frequency $f_{chop}$ may be preferable. A digital notch filter is a type of digital filter configured to attenuate or reject a specific narrow range of frequencies, typically centered around a particular frequency (here: $f_{chop}$), while allowing other frequencies to pass through unaffected. It may be used to remove or suppress unwanted interference or noise at a specific frequency in a digital signal. The primary purpose of a digital notch filter is to create a "notch" or a deep attenuation in the frequency response at a set of desired frequency (here: around $f_{chop}$). This can be achieved using various filter design techniques, such as Infinite Impulse Response (IIR) or Finite Impulse Response (FIR) filters. In an IIR digital notch filter, feedback is used to create a deep null or attenuation at the specified frequency. It is characterized by recursive equations that refer to previous output samples. IIR filters can provide high attenuation levels and are computationally efficient, but they may introduce phase distortion. FIR digital notch filters, on the other hand, are non-recursive filters that do not rely on feedback. They are configured using a finite number of coefficients and offer linear phase characteristics, meaning they do not introduce phase distortion. FIR filters can be configured to have a sharp notch and provide precise control over the frequency response.

In the sensor circuit 300 of FIG. 4A, the filtered digital signal 332 at the output of digital filter 330 is then coupled to a digital decimation filter 340 to convert the filtered digital signal 332 to a digital output signal (DOUT) at output data rate $f_D<f_s$. The digital decimation filter 340 filter may take the filtered digital signal 332 sampled at $f_s$ and convert it into a high-resolution, slower digital code. While most converters have one sampling rate, a ΣΔ-ADC has two—the input sampling rate/frequency $f_s$ and an output data rate $f_D$. The decimation filter 340 is a type of digital filter to reduce the sample rate of the filtered digital signal 332. The primary purpose of the decimation filter 340 is to extract a lower-rate representation of the filtered digital signal 332 while preserving the essential information. It achieves this by filtering out unwanted high-frequency components and then discarding or down sampling a portion of the filtered signal. The decimation filter 340 may incorporate an anti-aliasing filter as its first stage. The anti-aliasing filter attenuates the high-frequency components above the desired signal bandwidth to prevent aliasing when the signal is subsequently down sampled. The filter removes unwanted spectral content that can cause distortion or artifacts in the down sampled signal. After the anti-aliasing filtering, the decimation filter 340 may reduce the sample rate by discarding or selecting a subset of samples from the filtered signal. Down sampling reduces the number of samples in the signal while maintaining the desired frequency content within the reduced bandwidth. The digital decimation filter 340 can be implemented using various digital filter structures, such as Finite Impulse Response (FIR) or Infinite Impulse Response (IIR) filters.

Figure 4B:
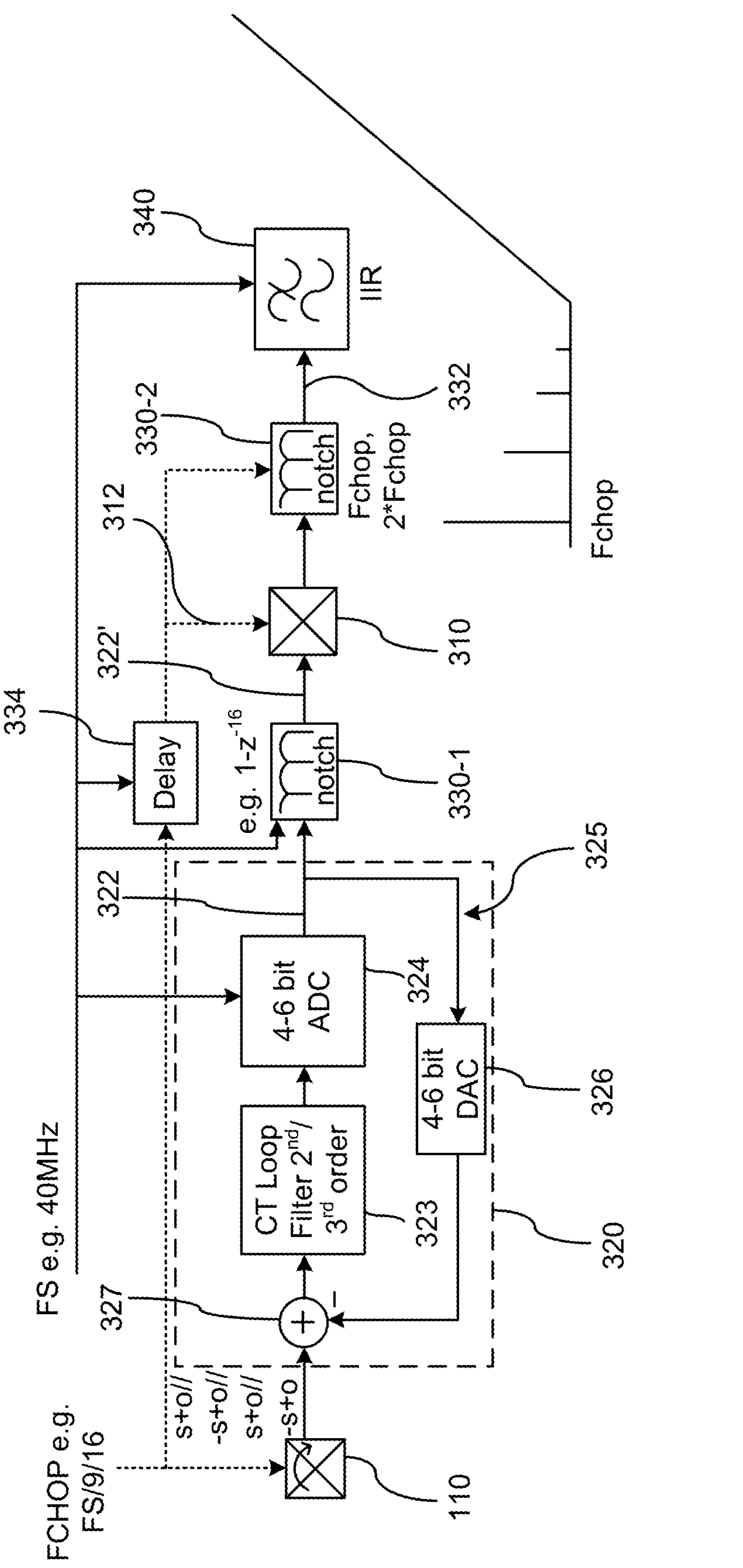
FIG. 4B shows a second implementation of the sensor circuit of FIG. 3.

FIG. 4B shows another implementation of the sensor circuit 300 including the non-chopped ΣΔ-ADC or ΣΔ-modulator circuit 320.

In the sensor circuit of FIG. 4B, the chopped digital signal 322 at the output of multi-bit ADC 324 is fed to a first digital notch filter 330-1 which is coupled between the multi-bit ADC 324 and the digital chopper circuit (demodulator) 310. The first digital notch filter 330-1 may have a notch at least at the chopping frequency $f_{chop}$ and/or at one or more harmonics thereof. For example, first digital notch filter 330-1 may be configured to remove the $7^{th}$ and/or $9^{th}$ harmonic of the chopping frequency $f_{chop}$. In case of an FIR filter, the first digital notch filter 330-1 may cause a filter delay. Therefore, the sensor circuit 300 of FIG. 4B further comprises a delay element 334 coupled between the chopping clock signal and the digital chopper circuit 310. The delay element 334 is configured to cause a delay of the chopping signal corresponding to the filter delay of first digital notch filter 330-1. The delayed (sinusoidal) chopping signal may then be multiplied with a digital output signal of first digital notch filter 330-1 to obtain a filtered chopped digital signal 322'. Filtered chopped digital signal 322' may then be further processed as explained with reference to FIG. 4A. The use of two notch filters 330-1, 330-2 in the implementation of FIG. 4B may be beneficial to better reduce signal components at the chopping frequency $f_{chop}$ and harmonics thereof. Instead of or in addition to the first digital notch filter 330-1, also a lowpass filter is conceivable which is configured to allow the signal component at the original frequency pass through while attenuating signal components at the chopping frequency $f_{chop}$ or higher.

The present disclosure proposes a non-chopped wideband/bandpass CT Sigma-Delta ADC to pass both the chopped signal and the offset. Instead of a conventional feedback loop used to remove the offset, instead of chopping the integrator stages inside the Sigma-Delta ADC, the present disclosure proposes to use digital-only techniques to remove offset and reduce the noise folding associated with demodulating quantization noise from harmonics of the chopped signal.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor or other programmable hardware component. Thus, steps, operations or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F) PLAs), (field) programmable gate arrays ((F) PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

Aspects

The following provides an overview of some Aspects of the present disclosure:

Aspect 1: A sensor circuit, comprising: an analog chopper circuit configured to shift an analog input signal from an original frequency to a chopping frequency to generate a chopped analog signal; a sigma-delta ( )-modulator coupled to an output of the analog chopper circuit and configured to digitize the chopped analog signal at a sampling frequency to generate a chopped digital signal; and a digital chopper circuit coupled to an output of the -modulator and configured to demodulate the chopped digital signal to generate a demodulated chopped digital signal having a signal component at the original frequency.

Aspect 2: The sensor circuit of Aspect 1, wherein the -modulator is configured without a chopper circuit.

Aspect 3: The sensor circuit of any of Aspects 1-2, wherein a ratio between the sampling frequency of the -modulator and the chopping frequency is larger than 100.

Aspect 4: The sensor circuit of any of Aspects 1-3, wherein the -modulator comprises an analog-to-digital converter (ADC) and an analog loop filter coupled between the output of the analog chopper circuit and the ADC.

Aspect 5: The sensor circuit of Aspect 4, wherein the analog loop filter is implemented as continuous time loop filter.

Aspect 6: The sensor circuit of any of Aspects 1-5, wherein the -modulator comprises a first multi-bit analog-to-digital converter (ADC) configured to convert the chopped analog signal from analog to digital to generate the chopped digital signal.

Aspect 7: The sensor circuit of Aspect 6, wherein the first multi-bit ADC has a bit width equal to or larger than two bits.

Aspect 8: The sensor circuit of Aspect 6, wherein the -modulator comprises a feedback path that extends from the output of the -modulator to an input of the -modulator, the feedback path comprising a second multi-bit DAC configured to convert the chopped digital signal back to analog.

Aspect 9: The sensor circuit of Aspect 8, wherein the second multi-bit DAC has a bit width equal to or larger than two bits.

Aspect 10: The sensor circuit of any of Aspects 1-9, wherein the -modulator comprises a single-bit analog-to-digital converter (ADC) configured to convert the chopped analog signal from analog to digital to generate the chopped digital signal.

Aspect 11: The sensor circuit of Aspect 10, wherein the -modulator comprises a feedback path that extends from the output of the -modulator to an input of the -modulator, the feedback path comprising a single-bit digital-to-analog converter (DAC) configured to convert the chopped digital signal back to analog.

Aspect 12: The sensor circuit of any of Aspects 1-11, further comprising: a digital filter coupled to an output of the digital chopper circuit and configured to reject at least the chopping frequency.

Aspect 13: The sensor circuit of Aspect 12, wherein the digital filter comprises a notch filter having a notch at least at the chopping frequency.

Aspect 14: The sensor circuit of Aspect 12, wherein the digital filter comprises a lowpass filter configured to allow the signal component at the original frequency to pass through while attenuating signal components at the chopping frequency or higher.

Aspect 15: The sensor circuit of Aspect 12, wherein the digital filter comprises a combination of a lowpass filter and a notch filter.

Aspect 16: The sensor circuit of any of Aspects 1-15, further comprising: a digital filter coupled between the -modulator and the digital chopper circuit and configured to reject harmonics of the chopping frequency.

Aspect 17: The sensor circuit of Aspect 16, wherein the digital filter is configured to cause a filter delay, wherein the sensor circuit further comprises a delay element coupled between a chopping clock signal and the digital chopper circuit, and wherein the delay element is configured to cause a delay of the chopping clock signal corresponding to the filter delay.

Aspect 18: The sensor circuit of any of Aspects 1-17, further comprising: an amplifier coupled between the analog chopper circuit and the -modulator and configured to amplify the chopped analog signal.

Aspect 19: The sensor circuit of any of Aspects 1-18, wherein the digital chopper circuit is configured to multiply the chopped digital signal with a digital sinusoidal signal having the chopping frequency.

Aspect 20: A system configured to perform one or more operations recited in one or more of Aspects 1-19.

Aspect 21: An apparatus comprising means for performing one or more operations recited in one or more of Aspects 1-19.

The invention claimed is:

1. A sensor circuit, comprising:

an analog chopper circuit configured to shift an analog input signal from an original frequency to a chopping frequency to generate a chopped analog signal;

a sigma-delta (ΣΔ)-modulator coupled to an output of the analog chopper circuit and configured to digitize the chopped analog signal at a sampling frequency to generate a chopped digital signal; and a digital chopper circuit coupled to an output of the ΣΔ-modulator and configured to demodulate the chopped digital signal to generate a demodulated chopped digital signal having a signal component at the original frequency, wherein a ratio between the sampling frequency of the ΣΔ-modulator and the chopping frequency is larger than 100.

2. The sensor circuit of claim 1, wherein the ΣΔ-modulator is configured without a chopper circuit.

3. The sensor circuit of claim 1, wherein the ΣΔ-modulator comprises an analog-to-digital converter (ADC) and an analog loop filter coupled between the output of the analog chopper circuit and the ADC.

4. The sensor circuit of claim 3, wherein the analog loop filter is implemented as continuous time loop filter.

5. The sensor circuit of claim 1, wherein the ΣΔ-modulator comprises a first multi-bit analog-to-digital converter (ADC) configured to convert the chopped analog signal from analog to digital to generate the chopped digital signal.

6. The sensor circuit of claim 5, wherein the first multi-bit ADC has a bit width equal to or larger than two bits.

7. The sensor circuit of claim 1, wherein the ΣΔ-modulator comprises a single-bit analog-to-digital converter (ADC) configured to convert the chopped analog signal from analog to digital to generate the chopped digital signal.

8. The sensor circuit of claim 1, further comprising:

a digital filter coupled to an output of the digital chopper circuit and configured to reject at least the chopping frequency.

9. The sensor circuit of claim 8, wherein the digital filter comprises a notch filter having a notch at least at the chopping frequency.

10. The sensor circuit of claim 8, wherein the digital filter comprises a lowpass filter configured to allow the signal component at the original frequency to pass through while attenuating signal components at the chopping frequency or higher.

11. The sensor circuit of claim 8, wherein the digital filter comprises a combination of a lowpass filter and a notch filter.

12. The sensor circuit of claim 1, further comprising:

an amplifier coupled between the analog chopper circuit and the ΣΔ-modulator and configured to amplify the chopped analog signal.

13. The sensor circuit of claim 1, wherein the digital chopper circuit is configured to multiply the chopped digital signal with a digital sinusoidal signal having the chopping frequency.

14. A sensor circuit, comprising:

an analog chopper circuit configured to shift an analog input signal from an original frequency to a chopping frequency to generate a chopped analog signal;

a sigma-delta (ΣΔ)-modulator coupled to an output of the analog chopper circuit and configured to digitize the chopped analog signal at a sampling frequency to generate a chopped digital signal; and a digital chopper circuit coupled to an output of the ΣΔ-modulator and configured to demodulate the chopped digital signal to generate a demodulated chopped digital signal having a signal component at the original frequency, wherein the ΣΔ-modulator comprises a first multi-bit analog-to-digital converter (ADC) configured to convert the chopped analog signal from analog to digital to generate the chopped digital signal, and wherein the ΣΔ-modulator comprises a feedback path that extends from the output of the ΣΔ-modulator to an input of the ΣΔ-modulator, the feedback path comprising a second multi-bit DAC configured to convert the chopped digital signal back to analog.

15. The sensor circuit of claim 14, wherein the second multi-bit DAC has a bit width equal to or larger than two bits.

16. A sensor circuit, comprising:

an analog chopper circuit configured to shift an analog input signal from an original frequency to a chopping frequency to generate a chopped analog signal;

a sigma-delta (ΣΔ)-modulator coupled to an output of the analog chopper circuit and configured to digitize the chopped analog signal at a sampling frequency to generate a chopped digital signal; and a digital chopper circuit coupled to an output of the ΣΔ-modulator and configured to demodulate the chopped digital signal to generate a demodulated chopped digital signal having a signal component at the original frequency, wherein the ΣΔ-modulator comprises a single-bit analog-to-digital converter (ADC) configured to convert the chopped analog signal from analog to digital to generate the chopped digital signal, and wherein the ΣΔ-modulator comprises a feedback path that extends from the output of the ΣΔ-modulator to an input of the ΣΔ-modulator, the feedback path comprising a single-bit digital-to-analog converter (DAC) configured to convert the chopped digital signal back to analog.

17. A sensor circuit, comprising:

an analog chopper circuit configured to shift an analog input signal from an original frequency to a chopping frequency to generate a chopped analog signal;

a sigma-delta (ΣΔ)-modulator coupled to an output of the analog chopper circuit and configured to digitize the chopped analog signal at a sampling frequency to generate a chopped digital signal;

a digital chopper circuit coupled to an output of the ΣΔ-modulator and configured to demodulate the chopped digital signal to generate a demodulated chopped digital signal having a signal component at the original frequency; and a digital filter coupled between the ΣΔ-modulator and the digital chopper circuit and configured to reject harmonics of the chopping frequency.

18. The sensor circuit of claim 17, wherein the digital filter is configured to cause a filter delay, wherein the sensor circuit further comprises a delay element coupled between a chopping clock signal and the digital chopper circuit, and wherein the delay element is configured to cause a delay of the chopping clock signal corresponding to the filter delay.

* * * * *